great(12) United States Patent
Ogashiwa et al.

(10) Patent No.: US 10,256,113 B2
(45) Date of Patent: Apr. 9, 2019

(54) TRANSFER SUBSTRATE FOR FORMING METAL WIRING AND METHOD FOR FORMING METAL WIRING WITH THE TRANSFER SUBSTRATE

(71) Applicant: Tanaka Kikinzoku Kogyo K.K., Tokyo (JP)

(72) Inventors: Toshinori Ogashiwa, Kanagawa (JP); Masaaki Kurita, Kanagawa (JP); Takashi Nishimori, Kanagawa (JP); Yukio Kanehira, Kanagawa (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 1183 days.

(21) Appl. No.: 14/354,134

(22) PCT Filed: Nov. 8, 2012

(86) PCT No.: PCT/JP2012/078935
§ 371 (c)(1),
(2) Date: Apr. 24, 2014

(87) PCT Pub. No.: WO2013/073440
PCT Pub. Date: May 23, 2013

(65) Prior Publication Data
US 2014/0262003 A1 Sep. 18, 2014

(30) Foreign Application Priority Data
Nov. 18, 2011 (JP) ................ P2011-252138

(51) Int. Cl.
*H01L 21/48* (2006.01)
*H01L 23/00* (2006.01)
(Continued)

(52) U.S. Cl.
CPC ............ *H01L 21/4814* (2013.01); *B22F 7/08* (2013.01); *B23K 35/007* (2013.01); *B23K 35/025* (2013.01); *B23K 35/0244* (2013.01); *B23K 35/3006* (2013.01); *B23K 35/3013* (2013.01); *B23K 35/322* (2013.01); *B32B 15/018* (2013.01); *C22C 5/02* (2013.01); *C22C 5/04* (2013.01); *C23C 18/165* (2013.01); *C25D 7/00* (2013.01); *H01L 21/71* (2013.01); *H01L 24/03* (2013.01); *H01L 24/11* (2013.01); *B23K 2035/008* (2013.01); *B23K 2101/40* (2018.08); *H01L 24/05* (2013.01); *H01L 24/13* (2013.01); *H01L 24/94* (2013.01); *H01L 2224/031* (2013.01); *H01L 2224/03003* (2013.01); *H01L 2224/0312* (2013.01); *H01L 2224/03334* (2013.01); *H01L 2224/0401* (2013.01); *H01L 2224/0508* (2013.01); *H01L 2224/0567* (2013.01); *H01L 2224/05082* (2013.01); *H01L 2224/05083* (2013.01); *H01L 2224/05139* (2013.01); *H01L 2224/05144* (2013.01); *H01L 2224/05166* (2013.01); *H01L 2224/05169* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05673* (2013.01); *H01L 2224/05676* (2013.01); *H01L 2224/05678* (2013.01); *H01L 2224/05681* (2013.01); *H01L 2224/05684* (2013.01);
(Continued)

(58) Field of Classification Search
CPC ..... H01L 21/4814; H01L 21/71; H01L 24/11; H01L 24/03; B23K 35/3006; B23K 35/3013
See application file for complete search history.

(56) References Cited

U.S. PATENT DOCUMENTS 4,494,688 A * 1/1985 Hatada ................ H01L 21/4825
228/180.22
4,856,185 A 8/1989 Baumgartner et al.
(Continued)

FOREIGN PATENT DOCUMENTS

DE 102009018541 A1 10/2010
EP 2645409 A1 10/2013
(Continued)

OTHER PUBLICATIONS

Machine translation of JP2005216508.*
(Continued)

*Primary Examiner* — Jessee R Roe
(74) *Attorney, Agent, or Firm* — Roberts & Roberts, LLP

(57) ABSTRACT

A transfer substrate for transferring a metal wiring material to a transfer target including a substrate, at least one metal wiring material formed on the substrate, at least one coating layer formed on a surface of the metal wiring material, and an underlying metal film formed between the substrate and the metal wiring material, in which the metal wiring material is a compact formed by sintering metal powder such as gold powder having a purity of 99.9 wt % or more and an average particle size of 0.01 μm to 1.0 μm, and the coating layer is a predetermined metal such as gold or an alloy having a different composition from that of the metal wiring material and has a total thickness of 1 μm or less, and the metal underlying film is made of a predetermined metal such as gold or an alloy. The transfer substrate can lower heating temperature on the transfer target side.

9 Claims, 1 Drawing Sheet

(51) Int. Cl.

| | |
|---|---|
| *H01L 21/71* | (2006.01) |
| *B23K 35/30* | (2006.01) |
| *B22F 7/08* | (2006.01) |
| *B23K 35/32* | (2006.01) |
| *B23K 35/02* | (2006.01) |
| *B23K 35/00* | (2006.01) |
| *B32B 15/01* | (2006.01) |
| *C25D 7/00* | (2006.01) |
| *C22C 5/02* | (2006.01) |
| *C22C 5/04* | (2006.01) |
| *C23C 18/16* | (2006.01) |
| *B23K 101/40* | (2006.01) |

(52) U.S. Cl.
CPC ............... *H01L 2224/111* (2013.01); *H01L 2224/11003* (2013.01); *H01L 2224/1112* (2013.01); *H01L 2224/11334* (2013.01); *H01L 2224/11505* (2013.01); *H01L 2224/1317* (2013.01); *H01L 2224/13082* (2013.01); *H01L 2224/13083* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13169* (2013.01); *H01L 2224/13171* (2013.01); *H01L 2224/13173* (2013.01); *H01L 2224/13176* (2013.01); *H01L 2224/13178* (2013.01); *H01L 2224/13181* (2013.01); *H01L 2224/13184* (2013.01); *H01L 2224/94* (2013.01); *H01L 2924/0104* (2013.01); *H01L 2924/01006* (2013.01); *H01L 2924/01024* (2013.01); *H01L 2924/01029* (2013.01); *H01L 2924/01033* (2013.01); *H01L 2924/01044* (2013.01); *H01L 2924/01045* (2013.01); *H01L 2924/01047* (2013.01); *H01L 2924/01073* (2013.01); *H01L 2924/01074* (2013.01); *H01L 2924/01077* (2013.01); *H01L 2924/01078* (2013.01); *H01L 2924/01079* (2013.01); *H01L 2924/1461* (2013.01); *H01L 2924/15788* (2013.01); *H01L 2924/181* (2013.01); *Y10T 428/12056* (2015.01)

(56) References Cited

U.S. PATENT DOCUMENTS

| | | |
|---|---|---|
| 2011/0272802 A1 | 11/2011 | Ogashiwa |
| 2013/0196504 A1 | 8/2013 | Ogashiwa |

FOREIGN PATENT DOCUMENTS

| | | |
|---|---|---|
| JP | 5-144870 A | 6/1993 |
| JP | 6-267963 A | 9/1994 |
| JP | 2005166739 A | 6/2005 |
| JP | 2005216508 A | 8/2005 |
| JP | 2006-260954 A | 9/2006 |
| JP | 2011-040617 A | 2/2011 |
| JP | 2012-114310 A | 6/2012 |
| WO | WO2012070480 A1 | 5/2012 |

OTHER PUBLICATIONS

Machine translation of DE102009018541 A1.*
Chuang CH-L et al: "Thermosonic Flip-Chip Bonding for Stud Bumps onto Copper Electrodes with Titanium and Silver layers"; International Microsystems, Packaging, Assembly and Circuits Technology Conference, 2007 (IMPACT 2007), Oct. 1-3, 2007, IEEE, PI, Oct. 1, 2007 (Oct. 1, 2007), pp. 266-269, XP031204349, DOI: 10.1109/IMPACT.2007.4433614 ISBN: 978-1-4244-1636-3.
Bai G: "Low-Temperature Sintenng of Nanoscale Silver Paste for Semiconductor Device Interconnection", Dissertation Submitted to the Faculty of the Virginia Polytechnic Institute and State University in Partial Fulfillment of the Requirement for the Degree of Doctor of Philosophy in Materials Science A; Oct. 2005 (Oct. 2005), pp. 1-195, XP009166994.
Goodwin F: "Chapter 3.1.10.1. Silver and Silver Alloys, Chapter 3.1.10.2. Gold and Gold Alloys.. (Selection)" In: "Springer Handbook of Condensed Matter and Materials Data", 2005, Springer, DE, XP55229590, ISBN: 978-3-540-44376-6 p. 342-343, 360, DOI: 10.1O07/3-54O-3O437-I_5, * figs. 3.1-211, 3.1-248.
Kirsch R G et al: "Interdiffusion mechanisms in Ag—Au thin-film couples", Applied Physics Letters, vol. 29, No. 12, 1976, pp. 772-775, XP055198762, ISSN: 0003-6951, DOI: 10.1063/1.88944.
Mertens CH: "Die Niedertemperatur-Verbindungstechni k der Leistungselektronik [Fortschritt-Berichte VDI: REIHE 21, Elektrotechnik; 365]", "Chapter 2: NTV-Technologie" 2004, VDI Verlag, Dusseldorf, Germany, XP55087239, ISBN: 978-3-18-336521-0 pp. 6-36, section 2, first paragraph * section 2.1, first paragraph *section 2.1, sixth paragraph.
Mertens CH: Eigenschaften und Charakterisierung von NTV-Verbindungen In: "Die Niedertemperatur-Verbindungstechnik der Leistungselektronik [Fortschritt-Berichte VDI: REIHE 21, Elektrotechnik; 365]", "Chapter 4" 2004, VDI Verlag, Dusseldorf, Germany, XP001526268, ISBN: 978-3-18-336521-0 pp. 73-115, section 4.2, subsection "L-Schaltest", second paragraph, point 1 * section 4.4, last paragraph *.
EP12849763 Search Report and Written Opinion.

* cited by examiner

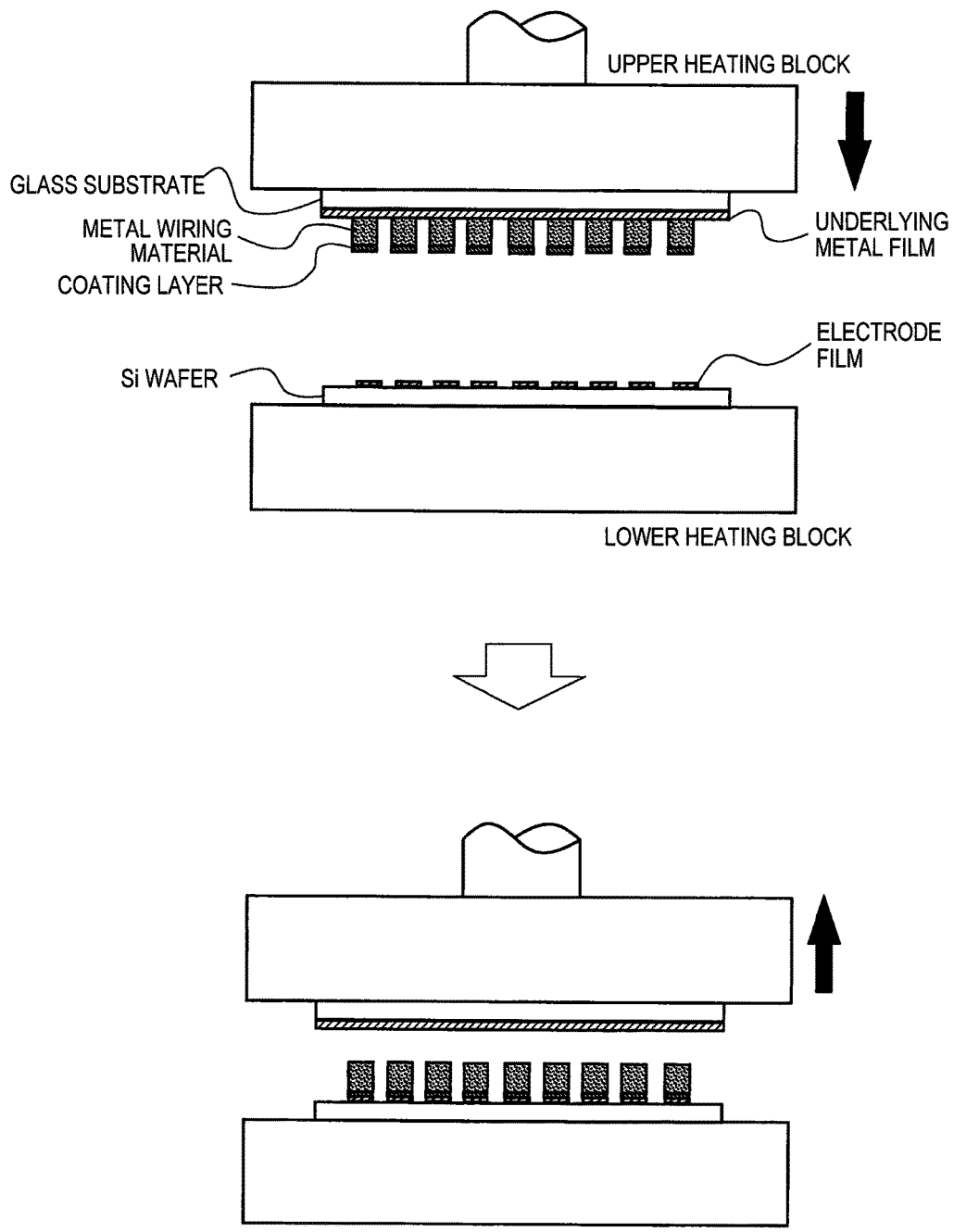

TRANSFER SUBSTRATE FOR FORMING METAL WIRING AND METHOD FOR FORMING METAL WIRING WITH THE TRANSFER SUBSTRATE

BACKGROUND OF THE INVENTION

1. Field of the Invention

The present invention relates to a transfer substrate for forming a metal wiring on a transfer target such as a semiconductor wafer, a compound wafer and a MEMS wafer, and relates to a metal wiring method using the same.

2. Description of the Related Art

With increasing packaging density of electronic components such as a semiconductor chip, their implementation method has changed from a conventional wire bonding method to a wireless implementation method such as a flip-chip bonding method in which a semiconductor chip is directly mounted on a circuit board, which has become a mainstream. A manufacturing process of electronic components using this implementation method is a process in which a bump is formed on a terminal electrode on a semiconductor chip of a device wafer or on an external electrode for connecting to a semiconductor chip, thus metal wiring being made up, and then this is face-down bonded onto a substrate. Further, it is common that before the formation of the bump, metallization treatment is performed on the terminal electrode and the like to form a barrier metal layer, and then the bump is formed thereon.

As for a conventional method of the bump formation process, a method using a plating technique was common. Since a bump formed with a plating technique has dense and excellent electrical conduction characteristics, the bump is thought to be useful as an electrode. However, there is a concern that the bump formation with a plating technique cannot sufficiently deal with miniaturization of metal wiring that is likely to make more progress in the future. Therefore, there has been proposed a bump formation method with a transfer method using a transfer substrate as described in Patent Document 1.

In the bump formation method with a transfer substrate, a transfer substrate in which a wiring material to be a bump is formed on a substrate of glass or the like is prepared in advance. Then, the transfer substrate is covered onto a wafer that has been subjected to metallization treatment in advance, and then pressed and heated to transfer the wiring material to the wafer and thus the bump is formed in this method. In this method, any wiring material on the transfer substrate can be transferred to any position of the wafer by controlling pressure and heating, and thus miniaturization of the metal wiring becomes possible. Furthermore, wiring formation in a bad sector on the wafer can be avoided, and a waste of material can be also avoided.

PRIOR ART DOCUMENTS

Patent Documents

[Patent Document 1] Japanese Patent Application Laid-open No. 5-144870

SUMMARY OF THE INVENTION

Problems to be Solved by the Invention

For the process of the bump formation with the above-described transfer substrate, heating of a transfer substrate and a wafer is required. Specifically, as for the above-described conventional transfer substrate, the heating temperature of the wafer side is set to 300 to 400° C., and that of the transfer substrate side is set to 100 to 200° C. However, when the heating temperature of the wafer side is increased to a high temperature (300° C. or higher), in a case that a semiconductor circuit is formed on the wafer, there is a concern of damage to the circuit. Therefore, it is basically preferable to lower a heating temperature during the bump transfer whereas the heating temperature of the wafer side cannot be easily decreased. The reason is as follows: a bump on a conventional transfer substrate is generally formed with a plating technique, and sufficient joint between the bump between a wafer is required in order to securely transfer the bump formed with plating to the wafer, and thus high temperature heating is needed.

Then, from the viewpoint of protection of a semiconductor circuit on the wafer, it is preferable to form the bump on the wafer with as few steps as possible after formation of the semiconductor circuit on the wafer. In this regard, not only the above-described heating during the transfer, metallization treatment for formation of a barrier layer is also a load for the semiconductor circuit.

In the context of the above problem, the present invention provides a transfer substrate that reduces a load subjected to the transfer target such as high temperature heating with regard to the transfer substrate for forming a metal wiring on the transfer target such as a wafer with a transfer method. In addition, a formation method of the metal wiring with the transfer substrate is also disclosed.

Means for Solving the Problems

To solve the above problem, the present inventors have first conducted an investigation in order to decrease the transfer temperature of the transfer substrate in consideration of the technical knowledge the present inventors possess. Then, the present inventors have found that a compact having a high purity and formed by sintering metal powder having a fine particle size can be easily joined to the transfer target even at a relatively low temperature and further works as a metal wiring.

Then, the present inventors have further studied and thought that the sintered compact of metal powder as described above can be easily transferred due to its surface characteristics and that the surface of the sintered compact is coated with a metal in a range to be able to maintain the surface state, and thereby the metal coating layer could function as a conventional barrier metal layer. As a result from the above, the present inventors have arrived at the present invention.

That is, the present invention is a transfer substrate for transferring a metal wiring material to a transfer target, wherein the transfer substrate includes a substrate, at least one metal wiring material formed on the substrate, at least one coated layer formed on the surface of the metal wiring material, and an underlying metal film formed between the substrate and the metal wiring material; the metal wiring material is a compact formed by sintering one or more kinds of metal powder having a purity of 99.9 wt % or more and an average particle size of 0.01 µm to 1.0 µm selected from gold powder, silver powder, platinum powder, palladium powder and copper powder; the coated layer is made of any metal of gold, silver, platinum, palladium, ruthenium, rhodium, iridium, chromium, titanium, tungsten, tantalum, nickel, copper and zirconium or an alloy thereof; the coated layer is made of a metal or an alloy having different composition from that of the metal wiring material and has a total thickness of 1 μm or less; and the underlying metal film is made of any metal of gold, silver, platinum, palladium, ruthenium, rhodium, iridium, chromium, titanium, tungsten, tantalum, nickel, copper and zirconium or an alloy thereof.

Hereinafter, the present invention will be explained in detail. As described above, the transfer substrate according to the present invention is characterized in that a sintered compact formed by sintering predetermined metal powder is applied as a metal wiring material (bump) transferred to a transfer target (wafer). The metal wiring material made of this sintered compact is porous and unlike a dense material formed with plating of the conventional technique, and minute irregularities are present on the surface thereof. Then, the sintered compact is in point contact with the surface of the transfer target during the transfer. According to the present inventors, it is considered that the point contact state formed with this porous material can decrease the temperature required for a joint with the surface of the transfer target. Thereby, the temperature on the side of the transfer target during transfer can be lower (300° C. or lower) than a conventional temperature.

With respect to the metal wiring material made of this sintered compact, a purity and particle size of the metal powder being sintered and is defined because, as for the purity, electrical conductivity at the time of formation as a bump after transfer is considered. In a word, the reason is that a purity of 99.9 wt % or less is unlikely to secure necessary electrical conductivity. Further, as for a particle size of the metal powder, the reason is that large gaps easily occur in a compact of the metal powder having a particle size of greater than 1.0 jam, and thus necessary electrical conductivity cannot be secured eventually. Incidentally, it is preferable that a particle size of the metal powder is minute, but powder having a particle size of smaller than 0.01 μm is inferior in handling characteristics, and therefore the lower limit is set to 0.01 μm.

While the metal wiring material made of the sintered compact is porous, it is preferable that its density is 0.45 to 0.95 times the density of the metal powder. With progress of the sintering, the metal wiring material becomes denser, and its density is close to the density of the metal as a bulk. Since a metal wiring material having a density of more than 0.95 times that of the bulk metal is too hard, the transfer becomes difficult. On the other hand, a density less than 0.45 times the density of the bulk metal is not preferable for a metal wiring because contact among the metal powder is insufficient and then the electrical conductivity is poor.

In addition, the metal wiring material is composed of gold powder, silver powder, platinum powder, palladium powder and copper powder or alloy powder of these metals. This is because electrical conductivity required for the bump has been considered. In the metal wiring material, only one kind of these metal powders can be sintered, or two or more can be mixed. For example, only gold powder can be sintered or gold powder and palladium powder, gold powder and silver powder, etc. can be mixed and sintered.

Then, in the present invention, a metal coating layer is provided on the surface of the metal wiring material made of the sintered compact of metal powder. This coating layer exists between the transfer target and the metal wiring material (bump) after the transfer and acts as a barrier metal layer. Thereby, metallization treatment of the transfer, target is not required, and thus the load on the transfer target can be decreased. However, in order to maintain the ease of joint with the point contact of the surface of the above-described sintered compact, it is required that the thickness of the coating layer is so thin that the surface state of the sintered compact can be maintained. Therefore, it is necessary that the thickness of the coating layer is 1 μm or less. However, it is preferable to set the lower limit value of the coating layer to 0.003 μm. This is because if the coating layer is thinner than this value, it becomes difficult to ensure continuity required for the metal film.

The metal forming the coating layer is any metal of gold, silver, platinum, palladium, ruthenium, rhodium, iridium, chromium, titanium, tungsten, tantalum, nickel, copper and zirconium or an alloy, and the metal is different from the metal wiring material. In addition, the structure of the coating layer is preferably a dense thin film. Further, the layer can be a single layer, or can have a multilayer structure made of a plurality of metals, and its total thickness has only to be 1 μm or less.

There is no case that the metal wiring material is directly formed on the substrate, and an underlying metal film is formed between the metal wiring material and the substrate. Although a glass substrate is mostly used as the substrate, glass has poor joint characteristics with metal. Therefore, when the metal wiring material is directly formed on glass, it is likely to drop off the glass during handling of the transfer substrate. Thus, the underlying metal film is formed for securing adhesion of the metal wiring material. This underlying metal film is made of any metal of gold, silver, platinum, palladium, ruthenium, rhodium, iridium, chromium, titanium, tungsten, tantalum, nickel, copper and zirconium or an alloy.

The underlying metal film can be a metal having the same composition as the metal wiring material. On this point, it is different from the coating layer. However, a metal film having a different composition is preferred. When the composition is the same as that of the metal wiring material, adhesion between the metal wiring material and the underlying metal film increases, and thus there is a possibility that the metal wiring material remains on the substrate during the transfer to the transfer target. However, even when the underlying metal film and the metal wiring material are constituted with the same composition, the adhesion between the metal wiring material and the transfer target can be enhanced by adjusting heating condition and the like during the transfer, and thus the remaining can be avoided. In view of this, a different composition is not necessarily required.

It is preferable that the underlying metal film has a thickness of 1 to 100 nm. In case of smaller than 1 nm, since adhesion between the underlying metal film and the substrate is low, adhesion of the metal wiring material cannot be secured. Meanwhile, the upper limit is not particularly restricted, but even if the thickness is greater than 100 nm, there is no difference in effect. Then, with adjustment of the thickness of the underlying metal film within the above range, it is possible to adjust a transfer rate of the metal wiring material. When the underlying metal film and the metal wiring material are made of the same material (for example, when Au is used as the underlying metal film on a glass substrate and Au powder is used as the metal wiring material), adhesion between the underlying metal film and the metal wiring material increases. Therefore, with use of the underlying metal film having a smaller thickness, the underlying metal film can be peeled from the substrate during the transfer. This method for peeling the underlying metal film during the transfer with use of the underlying metal film having a smaller thickness provides effective adjustment of a transfer rate since it may be more possible to suppress remaining of the metal wiring material than a case of thickening the underlying metal film. When the underlying metal film is made thin for the peeling during transfer in such a way, it is preferable that its thickness is set to 1/3 or less of the average particle size of the metal powder constituting the metal wiring material.

The underlying metal film can be a single layer or can be formed of a plurality of layers. For example, it is allowed that after a titanium film is formed on a glass substrate, a gold film is formed thereon. It is also allowed that such a multilayer film is heat treated, then titanium is diffused on its outermost surface, and oxidization is performed to form an oxide.

Incidentally, Cr, W, TiW, etc. are metals that are easy to be oxidized. When these are used as a single layer, the surface may be subjected to oxygen plasma treatment to stabilize a surface oxide film. This oxygen plasma treatment is a plasma treatment in an ozone or oxygen atmosphere under reduced pressure or atmospheric pressure.

The substrate of which the metal wiring material is formed is generally glass or resin-reinforced glass as a material while metals such as silicon and Kovar can be also applied. Further, its thickness is not particularly limited, but 50 to 500 μm is preferable in consideration of handling characteristics and stability of the transfer.

In a manufacturing process of the transfer substrate according to the present invention, the underlying metal film is formed on a substrate of glass or the like, then the metal wiring material is formed, and further a coating layer is formed. For the formation of the underlying metal film, various thin film manufacturing processes such as a sputtering technique, a plating technique and a CVD technique can be applied.

On the other hand, as described above with respect to the formation of the metal wiring material, metal powder is sintered to form the metal wiring material in the present invention. In the formation of the metal wiring material made of metal powder, it is preferable that the formation is performed with use of a metal paste in which an organic solvent is appropriately added to the metal powder. This is because a paste can be applied in various ways as described below and can respond to miniaturization of wiring.

As an organic solvent of the metal paste, ester alcohol, terpineol, pine oil, butyl carbitol acetate, butyl carbitol and carbitol are preferred. For example, examples of a preferable ester alcohol organic solvent include 2,2,4-trimethyl-3-hydroxypentaisobutyrate ($C_{12}H_{24}O_3$). This is because this solvent can be dried at a relatively low temperature.

In addition to the above organic solvents, the metal paste may contain one or more kinds selected from acrylic resins, cellulose resins and alkyd resins. When these resins or the like are further added, aggregation of metal powder in the metal paste is prevented so that the paste becomes more homogeneous, and thus an unbiased bump can be formed. The respective examples are as follows: a methyl methacrylate polymer as the acrylic resins, ethyl cellulose as the cellulose resins, and a phthalic anhydride resin as the alkyd resins. Among these, ethyl cellulose is particularly preferable.

The applying process of the metal paste is not particularly limited and, for example, a bump-shaped mold can be mounted on the substrate and filled with the metal paste. Further, a resist can be used as in the case of bump formation with a conventional plating technique. As a method for applying the metal paste, it is possible to use various techniques such as a spin coating technique, a screen printing technique, an inkjet technique and a technique in which dropwise paste was spread with a spatula made of silicone rubber to fill a hole.

After the application of the metal paste, it is required to coat, dry and then sinter the metal paste. Thereby, a close state is formed in which there is point contact with each other between metal particles in the paste and between the joint surface (paste coated surface) of the joint member and the metal particle, and thus the shape of the metal wiring material is stabilized. The temperature of this sintering is preferably set to 80 to 300° C. since the point contact does not occur at lower than 80° C. Meanwhile, this is because when the sintering was performed at a temperature of higher than 300° C., the sintering excessively proceeds, and necking among the metal powder proceeds to generate strong bonding and an extremely hard state. Further, there is a possibility that heating at higher than 300° C. leads to deformation of the glass substrate. It is preferable that heating time during the sintering is 30 to 120 minutes. This is because the temperature of the sintering furnace is not stabilized in a short time and thus sufficient sintering is impossible whereas productivity is lowered when a heating time is too long. Also, it is preferable to carry out this sintering in the absence of pressure loading.

In the formation of the coating layer, as for the coating layer of thin film, similar to the underlying metal, there can be applied various thin film manufacturing processes such as a sputtering technique, a plating technique, a CVD technique or the like.

Next, the method for forming the metal wiring to the transfer target with the transfer substrate according to the present invention is basically the same as a method according to a conventional transfer method. In other words, the method includes that the transfer substrate is stacked with its surface on which the metal wiring material is formed being opposite to the transfer target (wafer), then the transfer substrate and the transfer target are heated and further the metal wiring material is pressed to the transfer target, and then the transfer substrate is removed after the metal wiring material is joined with the transfer target. At this time, in the present invention, the heating temperature of the transfer substrate is set to 80 to 200° C., and the heating temperature of the transfer target is set to 80 to 300° C.

In the present invention, it is possible to set the heating temperature of the transfer target to 80 to 300° C. that is lower than a temperature in a transfer process with a conventional transfer substrate. And the heating temperature of this transfer target is preferably 100 to 200° C. The purpose is to reliably transfer the metal wiring material from the transfer substrate and to effectively prevent overheating due to heat conduction from the transfer target to the transfer substrate. Further, it is more preferable to set the heating temperature of the transfer substrate to 100 to 200° C.

Further, in this transfer method, press, i.e. pressurization of the metal wiring material to the transfer target is necessary, but it is preferable to set this pressure to equal to or less than the yield strength of the metal wiring material. This is because pressurization that highly exceeds the yield strength deforms the metal wiring material, and its predetermined height and shape cannot be ensured. Specifically, it is preferable that the applied pressure is set to 0.1 to 1.5 times the yield strength of the metal wiring material.

It is preferable, at a site where the metal wiring is formed in the transfer target, to form in advance an electrode film made of a metal containing a metal constituting the metal wiring material of the transfer substrate. This is because the metal wiring material is surely transferred. However, quite the same composition is not necessary. For example, when the metal wiring material is made of a mixture of gold powder and silver powder, the electrode film for the transfer target may be composed of gold. Further, the electrode film may be a single layer or a multilayer, and the outermost surface has only to be made of a metal belonging to the same class as the metal wiring material.

Effect of the Invention

As explained above, the transfer substrate according to the present invention can stably transfer the metal wiring material even at a low heating temperature of the transfer target during the transfer. Thereby, damage of a semiconductor chip or the like on the transfer target can be suppressed. Furthermore, according to the present invention, a metal layer can be formed at a lower site of the bump without metallization treatment of the transfer target. Also in view of this, it is possible to decrease a load that the transfer target receives.

BRIEF DESCRIPTION OF THE DRAWING

FIG. 1 A diagram for schematically illustrating a forming process of the metal wiring in the present Embodiment.

DETAILED DESCRIPTION OF THE PREFERRED EMBODIMENTS

First Embodiment

A transfer substrate was prepared with a glass substrate, and with this being used, metal wiring formation on a Si wafer was performed.
(Production of the Transfer Substrate)

First, Pt was film-formed with sputtering as an underlying metal film on a glass substrate (diameter size 100 mm, 4 inches, average thickness 500 μm). In the Pt film formation, after the glass substrate was subject to cleaning with reverse sputtering (Ar pressure $2.8 \times 10^{-1}$ Pa, RF output 250 W, sputtering time 60 seconds), the film formation was performed with use of a Pt target under conditions of Ar pressure $7.0 \times 10^{-1}$ Pa, DC output 500 W and sputtering time 115 seconds, and thus a Pt film having a thickness of 20 nm was formed.

Next, a metal wiring material was formed on a glass substrate with use of a metal paste made of Au powder. The metal paste used here was prepared with a mixture of gold powder (average particle size: 0.3 μm) of a purity of 99.95 wt % produced with a wet reduction method and an ester alcohol (2,2,4-trimethyl-3-hydroxypentaisobutyrate ($C_{12}H_{24}O_3$)) as an organic solvent. In the formation of the metal wiring material, a photoresist is applied on the glass substrate, and a plurality of through holes were formed with a usual photolithography technique. Then, the metal paste was added dropwise to the surface of the photoresist, and the gold paste was filled in the through holes of the photoresist with a spin coating technique. Next, the substrate after the paste application was dried in a dryer with the temperature maintained at 50° C. or lower. A coating layer was formed on the dried metal paste.

Thereafter, the resist was peeled off with an organic solvent. After the peeling of the resist, the substrate was put into an electric furnace, and the gold powder was sintered to form a metal wiring material. The sintering temperature was 90° C., and the heating was carried out for 1 hour. In this Embodiment, 100 rectangular pieces of the metal wiring material (diameter size 50 μm, height 25 μm) were formed on the substrate at equal intervals.

Incidentally, in formation of the coating layer, i.e. the coating layer formation with a plating technique, a coating formation was appropriately performed with a commercially available plating solution under a recommended condition. Further, the coating layer can also be formed with a sputtering technique, in which a commercially available sputtering target material can be also used.
(Transfer to the Wafer)

With use of the transfer substrate prepared above, wiring formation on a Si wafer was carried out. FIG. 1 is a diagram illustrating its steps. As shown in FIG. 1, the transfer glass substrate prepared in this Embodiment is installed with adsorption on an upper heating block, and the Si wafer (dimensions, 100 mm, 4 inches) to form the wiring is installed on a lower heating block. On the surface of the Si wafer, Ti/Pt/Au (thickness 50 nm/50 nm/200 nm) is formed as an electrode film. After the installation of the transfer substrate and Si wafer, the upper heating block is lowered and thus the transfer substrate is adhered to the Si wafer. Then, the upper heating block was heated to 150° C., the lower heating block was heated to 150° C., the upper heating block was pressed at pressure of 30 MPa, and this pressing state was maintained for 10 minutes. After the time, the upper heating block was lifted up. The applied pressure at this time is set to 1.4 times yield strength (21 MPa) of the sintered compact of gold powder measured in advance at 150° C. or lower.

Remaining of the metal wiring material of the transfer substrate was confirmed after the lift-up of the upper heating block, but there is no transfer remaining, all of the metal wiring materials were transferred to the Si wafer, and formation of the metal wiring was confirmed. Further, regarding the transferred metal wiring, each height was measured to investigate a variation but the range was within ±0.5 μm, and its shape was also confirmed good.

Second Embodiment

Hereinafter, the transfer substrates were prepared with variously changing the configuration of metal powder (a metal paste), an underlying metal film and a coating layer that constitutes the metal wiring material on the transfer substrate, and each was used to perform metal wiring formation on a Si wafer. Preparation conditions of the transfer substrate are the same as in the case of First Embodiment except the kind of the metal powder and a target material for formation of the underlying metal (when the underlying metal film is an alloy, an alloy target having the same composition was used.). The configurations of the prepared transfer substrates are described below.

TABLE 1

| Sample No. | Metal Wiring Material Metal Powder | Metal Wiring Material Average Particle Size (μm) | Underlying Metal Film Material | Underlying Metal Film Film Thickness (nm) | Coating Layer Material | Coating Layer Film Thickness (μm) |
|---|---|---|---|---|---|---|
| 1 | Au | 0.01 | Pt | 1 | Ag (1) | 0.1 |
| 2 |  | 0.3 |  | 20 |  |  |
| 3 |  | 1 |  | 100 |  |  |
| 4 | Ag | 0.3 | Pt | 20 | Au | 0.1 |
| 5 | Pd |  |  |  |  |  |
| 6 | Pt |  | Au | 20 |  |  |
| 7 | Au | 0.3 | Au | 20 | Ag (1) | 0.1 |
| 8 |  |  | Ti |  |  |  |
| 9 |  |  | Ru |  |  |  |
| 10 |  |  | Pd |  |  |  |
| 11 |  |  | Cr |  |  |  |
| 12 |  |  | Ta |  |  |  |
| 13 |  |  | Ir |  |  |  |
| 14 |  |  | Au/Cr |  |  |  |
| 15 |  |  | Au/Ti |  |  |  |
| 16 |  |  | Pt—0.1% Zr |  |  |  |
| 17 |  |  | Au—0.1% Zr |  |  |  |
| 18 |  |  | Pt |  |  |  |
| 19 |  | 1.2 | Pt |  |  |  |
| 20 | Au | 0.3 | Ti | 50 | Ag (2) | 0.01 |
| 21 |  |  |  |  |  | 0.1 |
| 22 |  |  |  |  | Ag (1) | 0.01 |
| 23 |  |  |  |  |  | 0.1 |
| 24 |  |  |  |  |  | 1.0 |
| 25 |  |  |  |  |  | 1.1 |
| 26 |  |  |  |  | Pt | 0.01 |
| 27 |  |  |  |  |  | 0.1 |
| 28 |  |  |  |  |  | 1.0 |
| 29 |  |  |  |  |  | 1.1 |
| 30 |  |  |  |  | Ag/Pt | 0.05/0.05 |
| 31 |  |  |  |  | Cr/Pt | 0.05/0.05 |
| 32 |  |  |  |  | Ti/Pt | 0.05/0.05 |

All substrates are glass substrates.
Sample No. 2 is the same as First Embodiment
In Samples Nos. 14 and 15, after formation of the multilayer film (Au/Cr, Au/Ti), heating is performed under an air atmosphere at 250° C. for 1 hour to disperse Cr or Ti on the Au surface and to carry out surface oxidization under an air atmosphere.
As for Pt—0.1% Zr and Au—0.1% Zr, a monolayer film is formed from an alloy target.
Coating layer: Ag(1): electroless plating, Ag(2): electrolytic plating.
Electrolytic plating for both Au and Pt of the coating layer.
In Samples Nos. 30 to 32, the coating layer is a multilayer (metal wiring material/Pt/(Ag, Cr, Ti).

With use of the above-described various transfer substrates, the metal wiring formation to a Si wafer was carried out. In these tests, some metal films on the Si wafer are changed. In addition, some heating temperatures of the lower heating block are also changed. This test result is shown in Table 2.

TABLE 2

| Test No. | Sample No. | Transfer Substrate Wiring Material | Transfer Substrate Underlying Metal Film | Transfer Substrate Coating Layer | Wafer Electrode Film Outermost Surface | Transfer Condition Wafer Temperature/ Applied Pressure | Transfer Test Result Transfer Rate | Transfer Test Result Variation |
|---|---|---|---|---|---|---|---|---|
| 1 | 1 | Au | Pt | Ag (1) | Au | 80° C./1.5 | 100/100 | ±0.5 |
| 2 | 2 |  |  |  |  | 150° C./1.0 | 100/100 | ±0.5 |
| 3 | 3 |  |  |  |  | 300° C./0.1 | 100/100 | ±0.5 |
| 4 | 4 | Ag | Pt |  | Au | 150° C./1.0 | 100/100 | ±0.5 |
| 5 | 5 | Pd | Pt |  | Ag | 250° C./1.0 | 100/100 | ±0.5 |
| 6 | 6 | Pt | Au |  | Pd | 250° C./1.0 | 100/100 | ±0.5 |
| 7 | 7 | Au | Au | Ag (1) | Pt | 150° C./1.0 | 100/100 | ±0.5 |
| 8 | 8 |  | Ti |  | Au |  | 100/100 | ±0.5 |
| 9 | 9 |  | Ru |  |  |  | 100/100 | ±0.5 |
| 10 | 10 |  | Pd |  |  |  | 100/100 | ±0.5 |
| 11 | 11 |  | Cr |  |  |  | 100/100 | ±0.5 |
| 12 | 12 |  | Ta |  |  |  | 100/100 | ±0.5 |
| 13 | 13 |  | Ir |  |  |  | 100/100 | ±0.5 |
| 14 | 14 |  | Au/Cr |  |  |  | 100/100 | ±0.5 |

TABLE 2-continued

| Test No. | Sample No. | Transfer Substrate | | | Wafer Electrode Film Outermost Surface | Transfer Condition Wafer Temperature/ Applied Pressure | Transfer Test Result | |
|---|---|---|---|---|---|---|---|---|
| | | Wiring Material | Underlying Metal Film | Coating Layer | | | Transfer Rate | Variation |
| 15 | 15 | | Au/Ti | | | | 100/100 | ±0.5 |
| 16 | 16 | | Pt—Zr | | | | 100/100 | ±0.5 |
| 17 | 17 | | Au—Zr | | | | 100/100 | ±0.5 |
| 18 | 20 | Au | Ti | Ag (2) | Au | 200° C./1.0 | 100/100 | ±0.5 |
| 19 | 21 | | | | | | 100/100 | ±0.5 |
| 20 | 22 | | | Ag (1) | | | 100/100 | ±0.5 |
| 21 | 23 | | | | | | 100/100 | ±0.5 |
| 22 | 24 | | | | | | 100/100 | ±0.5 |
| 23 | 26 | | | Pt (2) | | | 100/100 | ±0.5 |
| 24 | 27 | | | | | | 100/100 | ±0.5 |
| 25 | 28 | | | | | | 100/100 | ±0.5 |
| 26 | 30 | | | Ag/Pt | | | 100/100 | ±0.5 |
| 27 | 31 | | | Cr/Pt | | | 100/100 | ±0.5 |
| 28 | 32 | | | Ti/Pt | | | 100/100 | ±0.5 |
| 29 | 18 | Au | Pt | Ag (1) | Au | 70° C./1.5 | 80/100 | ±0.5 or more |
| 30 | 19 | | | | | 300° C./1.5 | 90/100 | ±0.5 or more |
| 31 | 25 | | | Ag (1) (1.1 μm) | | 200° C./1.0 | 80/100 | ±0.5 or more |
| 32 | 29 | | | Pt (1.1 μm) | | | 70/100 | ±0.5 or more |

Applied Pressure represents (applied pressure of the transfer substrate/yield strength of the metal wiring material).

As can be seen from Table 2, in both cases when the metal wiring materials were formed with various kinds of metal powder and when the underlying metal film was changed, it is confirmed that reliable transfer is possible at a low temperature of 300° C. or lower. However, even at a low temperature, when the heating temperature on the side of the wafer is low, there is a tendency that the transfer rate is deteriorated (Test No. 29).

Further, in case that a metal powder having a coarse particle size was used (Test No. 30), even when the heating temperature on the side of the wafer was relatively high, a poor transfer rate is confirmed. Further, with respect to the coating layer, when the thickness was more than 1 μm, a decrease in transfer rate can be seen (Test Nos. 31 and 32).

Third Embodiment

Hereinafter, the bump formation was performed on the samples Nos. 20 to 32 of Second Embodiment in the same manner as Second Embodiment, and shear strength (joint strength) of the bump was measured. Two kinds of applied pressure (1 MPa, 5 MPa) were set in this Embodiment. In addition, measurement of the shear strength was performed with a bonding tester. The result is shown in Table 3.

TABLE 3

| Test No. | Transfer Substrate | | | | Shear Strength (MPa) | |
|---|---|---|---|---|---|---|
| | Sample No. | Wiring Material | Underlying Metal Film | Coating Layer | Pressing Weight 1 MPa | Pressing Weight 5 MPa |
| 1 | 20 | Au | Ti | Ag (2) | 30 | 31 |
| 2 | 21 | | | | 29 | 30 |
| 3 | 22 | | | Ag (1) | 32 | 35 |
| 4 | 23 | | | | 32 | 34 |
| 5 | 24 | | | | 22 | 28 |
| 6 | 25 | | | | 14 | 18 |
| 7 | 26 | | | Pt | 32 | 33 |

TABLE 3-continued

| Test No. | Transfer Substrate | | | | Shear Strength (MPa) | |
|---|---|---|---|---|---|---|
| | Sample No. | Wiring Material | Underlying Metal Film | Coating Layer | Pressing Weight 1 MPa | Pressing Weight 5 MPa |
| 8 | 27 | | | | 28 | 29 |
| 9 | 28 | | | | 21 | 23 |
| 10 | 29 | | | | 15 | 17 |
| 11 | 30 | | | Ag/Pt | 32 | 34 |
| 12 | 31 | | | Cr/Pt | 24 | 25 |
| 13 | 32 | | | Ti/Pt | 25 | 26 |

In consideration of yield strength (21 MPa) of the gold powder sintered compact based on Table 3, when the thickness of the coating layer was more than 1 μm (Test No. 6 (sample No. 25) and Test No. 10 (Sample No. 29)), the shear strength was less than 20 MPa and thus a lack of strength occurred. In case of the samples having a thickness of 1 μm or less, all of them retained good strength. This is thought to be because, as described above, when the coating layer becomes thicker, the surface state of the metal wiring material cannot be maintained and thus joint characteristics required for a sintered compact was decreased.

INDUSTRIAL APPLICABILITY

In the metal wiring formation on the transfer target such as a semiconductor wafer, a compound wafer and a MEMS wafer, the present invention can provide a processing step at a lower temperature than ever before, and can contribute to miniaturization and quality preservation of the metal wiring.

What is claimed is:
1. A metal wiring formation method comprising:
(a) providing a transfer substrate for transferring a metal wiring material to a transfer target, said transfer substrate comprising:

a substrate;

at least one metal wiring material formed on the substrate;

at least one coating layer formed on a surface of the metal wiring material; and an underlying metal film formed between the substrate and the metal wiring material, wherein the metal wiring material comprises a composition formed by sintering one or more kinds of metal powder having a purity of 99.9 wt % or more and an average particle size of 0.01 µm to 1.0 µm selected from gold powder, silver powder, platinum powder, palladium powder and copper powder;

the coating layer comprises one or more of any metal of gold, silver, platinum, palladium, ruthenium, rhodium, iridium, chromium, titanium, tungsten, tantalum, nickel, copper and zirconium or an alloy thereof;

the coating layer comprises a metal or an alloy having a different composition from the composition of the metal wiring material and has a total thickness of 1 µm or less; and the underlying metal film comprises one or more of any metal of gold, silver, platinum, palladium, ruthenium, rhodium, iridium, chromium, titanium, tungsten, tantalum, nickel, copper and zirconium or an alloy thereof;

(b) stacking the transfer substrate so as to be opposite to a transfer target;

(c) heating the transfer substrate and the transfer target; and (d) pressing the transfer substrate to join and transfer the metal wiring material to the transfer target, wherein a heating temperature of the transfer substrate is set to 80 to 200° C.; and a heating temperature of the transfer target is set to 80 to 300° C., wherein a pressure at the time of pressing the transfer substrate is set to 0.1 to 1.5 times the yield strength of the metal wiring material.

2. The metal wiring formation method according to claim 1, comprising: forming an electrode film made of a metal containing a metal constituting the metal wiring material of the transfer substrate on the transfer target; and then transferring the metal wiring material.

3. The metal wiring formation method according to claim 1, wherein the metal wiring material of the transfer substrate is manufactured by applying and sintering a metal paste composed of an organic solvent and one or more kinds of metal powder having a purity of 99.9 wt % or more and an average particle size of 0.01 µm to 1.0 µm selected from gold powder, silver powder, platinum powder, palladium powder and copper powder.

4. The metal wiring formation method according to claim 1 wherein the underlying metal film comprises a metal or an alloy having a different composition from that of the metal wiring material.

5. The metal wiring formation method according to claim 4, comprising: forming an electrode film made of a metal containing a metal constituting the metal wiring material of the transfer substrate on the transfer target; and then transferring the metal wiring material.

6. The metal wiring formation method according to claim 1 wherein the underlying metal film has a thickness of 1 to 100 nm.

7. The metal wiring formation method according to claim 6, comprising: forming an electrode film made of a metal containing a metal constituting the metal wiring material of the transfer substrate on the transfer target; and then transferring the metal wiring material.

8. The metal wiring formation method according to claim 4 wherein the underlying metal film has a thickness of 1 to 100 nm.

9. The metal wiring formation method according to claim 8, comprising: forming an electrode film made of a metal containing a metal constituting the metal wiring material of the transfer substrate on the transfer target; and then transferring the metal wiring material.

* * * * *